United States Patent [19]

Witting et al.

[11] Patent Number: 4,680,438
[45] Date of Patent: Jul. 14, 1987

[54] LAMINATED MATERIAL FOR ELECTRICAL CONTACTS AND METHOD OF MANUFACTURING SAME

[75] Inventors: Karin Witting, Maintal; Dieter Pöss, Hanau; Rudolf Schnabl, Rodenbach, all of Fed. Rep. of Germany

[73] Assignee: W. C. Heraeus GmbH, Hanau, Fed. Rep. of Germany

[21] Appl. No.: 826,874

[22] Filed: Feb. 6, 1986

[30] Foreign Application Priority Data

Mar. 14, 1985 [DE] Fed. Rep. of Germany ....... 3509039

[51] Int. Cl.⁴ ............................................. H01H 1/02
[52] U.S. Cl. .................... 200/268; 428/698; 428/929
[58] Field of Search ............... 428/698, 929; 200/265, 200/268; 29/622; 204/290 R, 291, 294

[56] References Cited

U.S. PATENT DOCUMENTS

| | | | |
|---|---|---|---|
| 3,788,968 | 1/1974 | Muller | 204/290 R |
| 4,151,325 | 4/1979 | Welch | 428/432 |
| 4,279,709 | 7/1981 | McIntyre et al. | 204/98 |
| 4,345,130 | 8/1982 | Okutomi et al. | 200/268 |
| 4,405,849 | 9/1983 | Frame | 200/262 |
| 4,480,010 | 10/1984 | Sasanuma et al. | 428/457 |
| 4,584,085 | 4/1986 | Beaver et al. | 204/290 R |

FOREIGN PATENT DOCUMENTS 2518325  6/1983  France .
56-159017 12/1981  Japan ................................ 200/268

OTHER PUBLICATIONS

Schnabl et al., "Microprocessor Controlled Contact Resistance Probe for Manufacturing Control and Development", Proceedings of the 27th Annual Meeting of the Holm Conference on Electrical Contacts, pp. 131-139.

Primary Examiner—John F. Terapane
Assistant Examiner—Eric Jorgensen
Attorney, Agent, or Firm—Felfe & Lynch

[57] ABSTRACT

Disclosed is a laminated material for electrical contacts having a support of base metal or of a base metal alloy, a contact layer of titanium nitride which in turn is covered with a mixed layer of titanium nitride and at least one noble metal. Also disclosed is a method for making the laminated material in a single step in a vacuum apparatus with reactive formation of the titanium nitride.

6 Claims, 1 Drawing Figure

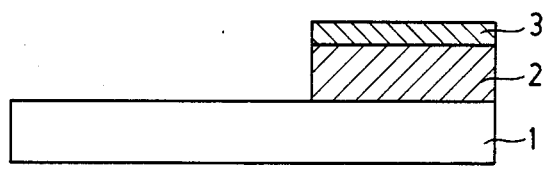

LAMINATED MATERIAL FOR ELECTRICAL CONTACTS AND METHOD OF MANUFACTURING SAME

BACKGROUND OF THE INVENTION

The invention relates to a laminated material for electrical contacts, preferably for switch contacts, plug contacts or wiping contacts, which has a contact layer of titanium nitride on a support such as a contact spring or a contact pin, made of a base metal or base metal alloy.

A laminated material of the kind specified above is disclosed in French published patent application No. 25 18 325. The contact layer of this laminate has good mechanical wear resistance, but the contact resistance of the titanium nitride layer is relatively high.

It is the object of the invention to improve the known laminate as regards its contact resistance, i.e., to reduce the latter, while retaining a very high mechanical wear resistance.

SUMMARY OF THE INVENTION

This object is achieved according to the invention, in a laminated material, in that the surface of the titanium nitride layer facing away from the support has a mixed coating of titanium nitride and at least one noble metal of the group: gold, silver, palladium, platinum, ruthenium, rhodium and iridium, whose thickness amounts to about one-tenth to three-tenths of the thickness of the titanium nitride layer, and whose noble metal content amounts to between 40 and 95%.

Mixed coatings in which the components, namely titanium nitride and noble metal, are uniformly distributed have proven useful. Particularly good results in regard to the reduction of contact resistance while retaining good mechanical wear resistance have been given by laminated materials according to the invention, in which there is a gradient of the concentration of the noble metal in the mixed coating, its concentration decreasing inwardly from the contact-making surface of the mixed coating.

In laminated materials according to the invention, the thickness of the titanium nitride coating is preferably in the range of 0.5 to 1.5 micrometers, and the thickness of the mixed coating is in the range of 0.05 to 0.45 micrometers.

Materials commonly used in contact technology have been found usable as material for the support, especially copper, copper alloys, nickel alloys, steel, molybdenum or tungsten.

The laminated materials for electrical contacts according to the invention are produced in a vessel containing argon, if desired, in which a pressure of less than $5 \times 10^{-2}$ mbar is maintained. The contact layer of titanium nitride is deposited on the support, while nitrogen is introduced into the vessel during the coating process for reaction with vaporized or sputtered titanium, and the titanium nitride formed as the reaction product is deposited on the heated support. After a given contact layer thickness is reached, in order to form a mixed layer without interrupting the formation of titanium nitride, noble metal is additionally vaporized or sputtered and is deposited on the contact layer together with the titanium nitride being formed. Before it is coated, it has been found desirable to heat the support to a temperature of at least 250° C. in the vessel in a heating station. The establishment of a concentration gradient in the mixed layer is accomplished, for example, by the use of shutters between the support and a titanium source and/or between the support and the noble metal source.

The laminated materials according to the invention have both high mechanical wear resistance and high electrical conductivity, i.e., low contact resistance. Therefore, laminates of the invention have improved mechanical and electrical properties in comparison with the known laminated material with a titanium nitride contact layer.

The titanium nitride contact layer acts on the titanium nitride particles also contained in the mixed layer as an effective support for the mixed layer, through whose noble metal content an extraordinary reduction of the contact resistance is achieved. The fact that titanium nitride is present both in the contact layer and in the mixed layer, and both layers are produced according to the invention without interrupting the coating process, results in an especially good mechanical bonding together of the two layers.

The various features of novelty which characterize the invention are pointed out with particularity in the claims annexed to and forming a part of this specification. For a better understanding of the invention, its operating advantages and specific objects obtained by its use, reference should be had to the accompanying drawings and descriptive matter in which there is illustrated and described a preferred embodiment of the invention.

BRIEF DESCRIPTION OF THE DRAWING

The FIGURE diagrammatically shows a laminated material made in accordance with the invention.

DESCRIPTION OF PREFERRED EMBODIMENT

Referring to the drawing, a support 1 of base metal is coated with a contact layer 2 of titanium nitride. A mixed layer 3 of titanium nitride and at least one noble metal is applied to the second surface of contact layer 2 facing away from the support 1, the surface of layer 2 being in contact with the base metal being considered as a first surface. The noble metal is gold, silver, palladium, platinum, ruthenium, rhodium and iridium and the like. The thickness of the contact layer 2 is preferably in the range of 0.8 to 1.2 micrometers, the thickness of the mixed layer between 0.08 and 0.36 micrometers. The noble metal concentration in the mixed layer is preferably between 70 and 90% of the mixed layer.

The production of a laminated material according to the invention, as represented in the FIGURE, is performed advantageously by reactive coating in an evacuated apparatus in which the titanium and the noble metal are produced, for example, by electron beam vaporization or by cathode sputtering, and in which nitrogen is introduced as the reaction gas in a vessel held under a vacuum while the coating is being performed. In the case of cathode sputtering, a carrier gas, usually argon, is additionally introduced into the evacuated vessel during the coating process. Ordinary commercially available coating apparatus can be used in performing the coating process.

The coating of the support 1, using an ordinary high-power sputtering apparatus, is accomplished as follows: A plurality of supports 1 are placed on substrate holders in a vessel which can be evacuated. This vessel contains both a sputtering cathode of titanium and a sputtering cathode of noble metal, gold for example, which are spaced apart from one another. It also contains a heating station in which the substrates disposed on the substrate holders are preheated, first to a temperature of at least 250° C., preferably at 350° C. The vessel is first evacuated to a high vacuum of $1 \times 10^{-5}$ mbar; then nitrogen and argon are introduced into the vessel through separate feed lines, so that a nitrogen partial pressure of about $3 \times 10^{-4}$ mbar is established, and maintained during the coating process. The argon feed is delivered such that a total pressure in the vessel of less than $5 \times 10^{-2}$ mbar, e.g., between $6 \times 10^{-3}$ and $2 \times 10^{-2}$, is maintained during the coating. The substrate holders with the preheated substrates are placed between the two sputtering cathodes and first titanium is sputtered, which reacts with the nitrogen in the vessel to form titanium nitride. The reaction product, titanium nitride, is deposited on the substrates. A typical substrate current density amounts to about 3 mA/cm$^2$ and the sputtering power ranges from about 15 to 20 W/cm$^2$. After the desired contact layer thickness is reached, gold is sputtered from the noble metal cathode without interrupting the titanium nitride formation, and the gold is deposited on the contact layer together with the titanium nitride to form the mixed layer, so that a uniform distribution of the mixed-layer components in the mixed layer is the result.

The following table illustrates a comparison of laminated material made according to the invention with a laminated material according to the prior state of the art described hereinbefore. The contact resistance, the performance under corrosion, and the wear resistance of the two laminated materials were tested. A comparison of the figures, which represent an average of numerous individual measurements, show the laminated material according to the invention is considerably superior to that of the state of the art. The data were obtained using test procedures commonly used in the field of electrical contact materials and known in themselves. The laminated material according to the invention was one in which the noble metal in the mixed layer consists of gold, which was uniformly distributed in titanium nitride. The concentration of the gold in the mixed layer was 95%. Molybdenum was used as the material of the support in both cases. The thickness of the contact layer amounted in both cases to 1 micrometer. The thickness of the mixed layer was 0.2 micrometers.

|  | Contact resistance at 20 cN | Corrosion test* contact resistance after exposure, contact force 20 cN | Performance under friction and corrosion** $R_k$ after 1000 wear cycles |
| --- | --- | --- | --- |
| Mo + TiN | 1 Ω | 10 Ω | 1 Ω |
| Mo + TiN and mixed layer | 10 m Ω | 10 m Ω | 10 m Ω |

*Corrosion conditions: 1 ppm H$_2$S; 25° C.; 75% rel. hum.; time: 21 days
**Track length 50 μm; mechanical load 50 cN; frequency 2 Hz.

The terms and expressions which have been employed are used as terms of description and not of limitation, and there is no intention in the use of such terms and expressions of excluding any equivalents of the features shown and described or portions thereof, it being recognized that various modifications are possible within the scope of the invention.

The test procedures used for obtaining the comparison data disclosed in the above table are published in "Electrical Contacts 1981, Proceedings of the Twenty-Seventh Annual Meeting of the Holm Conference on electrical Contacts, 1981, Illinois Institute of Technology; Chicago, Ill., 1981, pages 131/139.

As described in Electrical Contacts 1981 the individual components for the complete measurement system are as follows:

(1) Detector unit with interface to microprocessor and power unit for sensor lift and specimen stepping motors;
(2) Reference electrode holder (interchangeable);
(3) Specimen stage with magazine containing samples. X-axis positioning by means of a stepping motor. The spacing of the individual test points on the sample can be preselected on the input keyboard. Adjustment of the magazine on the Y-axis is accomplished by a micrometer drive. Programmed positioning on the X-axis is possible with an additional stepping motor;
(4) Magazine with samples;
(5) 8-bit-microprocessor with hexa-decimal input keyboard; and
(6) Digital voltmeter.

In operation, variable parameters are entered separately, for example, the distance between measurement points, number of individual measurements, single or multiple measurements per sample or additional wiping action. Appropriate programming of the measurement procedure and analysis will take into account the thermal-e.m.f.'s which frequently arise with AgPd with AuNi contact materials.

For measurements on standardized test samples, the unit can be equipped with programmed test sequences. The input keyboard and extra cabinet are not required for this model.

The starting position of the sample magazine is set manually. Once the program has started, the microprocessor takes over the measurement procedure.

The lever arm with the probe is activated by a d.c. motor via a cam drive. To decrease contacting impulse and to increase the measurement sensitivity, the lowering velocity before contact is reduced. The drive motor is switched off during measurement so as to exclude, as far as possible, vibrations and electromagnetic interference.

The measurement current is turned on once the reference electrode has contacted the specimen. With a minimum open circuit voltage of 15 mV and a fixed measurement current of 1 or 10 mA (selectable), the electrical measurement conditions meet the requirements laid down by DIN 41 640. The thermal-e.m.f. is measured separately (zero current) and is substracted from the actual measured value. The resulting voltage drip, which provides a measure of the contact resistance between reference electrode and sample, is indicated on a high impedance voltmeter. After the transient phase of 3 seconds (selectable) the contact resistance depending on the voltage drop is calculated by the microprocessor and printed.

The reference electrode unit can be interchanged simply by plugging it into the supporting arm. Goldplatet rotating contacts, rivets and pins, respectively tips, can be used as reference electrodes. After each measurement the rotating measurement contact is rotated a few degrees. This technique prevents contamination being carried over from one measurement point to the next. After completion of measurement, the rotating measurement contact can be removed and cleaned, or if necessary, replaced. Calibration can be carried out using flat, solid gold samples or pre-aged SnNi as prescribed in ASTM B667-80.

The static contact force is regulated by adding weights to the supporting arm. The load range lies between 2 and 200 g.

Classification of the measured values and print-out on a teleprinter or similar device can be effected by means of the built-in microprocessor. Normal output devices can be used as recording instruments. Statistical Gauss and Weibull analyses can be carried out on the microprocessor with appropriate programming. For this it would, however, be more rational to substitute a small computer which can be connected to the KWA 07 in place of the microprocessor.

Contact components such as rivets, discs, spring contacts and starting materials in the form of strip profiles and wires are best suited to testing with the $R_c$ measurement instrument. More complicated geometrical specimen forms require the use of a special sample magazine.

What is claimed is:

1. A laminated material for an electrical contact, comprising:
   (a) a support of a base metal or base metal alloy;
   (b) a contact layer of titanium nitride having a first and a second surface, said first surface being in contact with a surface of the support; and
   (c) a mixed layer of titanium nitride and at least one noble metal selected from the group of gold, silver, palladium, platinum, ruthenium, rhodium and iridium, the mixed layer having a thickness of from about 1/10 to about 3/10 of that of the titanium nitride layer but not greater than about 0.45 micrometers, and having a noble metal content of from 40 to 95%, said mixed layer being in contact with said second surface.

2. The laminated material according to claim 1, wherein components of the mixed layer are uniformly distributed therein.

3. The laminated material of claim 1, wherein the mixed layer has a concentration gradient of the noble metal therein, the concentration diminishing in a direction moving away from a contacting surface of the mixed layer with said second surface.

4. The laminated material of claim 1, wherein the thickness of the titanium nitride layer is 0.5 to 1.5 micrometers and the thickness of the mixed layer is 0.05 to 0.45 micrometers.

5. The laminated material of claim 1, wherein the support consists of copper, a copper alloy, a nickel alloy, steel, molybdenum or tungsten.

6. The laminated material of claim 1 in a switch contact, a plug contact or a wiping contact.

* * * * *